(12) United States Patent
Kang et al.

(10) Patent No.: US 9,425,251 B2
(45) Date of Patent: Aug. 23, 2016

(54) THIN FILM TRANSISTOR SUBSTRATE AND ORGANIC LIGHT-EMITTING DIODE (OLED) DISPLAY HAVING THE SAME

(71) Applicant: Samsung Display Co., Ltd., Yongin, Gyeonggi-Do (KR)

(72) Inventors: Donghan Kang, Hwaseong-si (KR); Sunkwang Kim, Suwon-si (KR); Jaesik Kim, Hwaseong-si (KR); Hyeonsik Kim, Yongin-si (KR); Woonghee Jeong, Seoul (KR); Chaungi Choi, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 27 days.

(21) Appl. No.: 14/278,235

(22) Filed: May 15, 2014

(65) Prior Publication Data

US 2015/0129844 A1    May 14, 2015

(30) Foreign Application Priority Data

Nov. 8, 2013    (KR) .................. 10-2013-0135474

(51) Int. Cl.
*H01L 29/06* (2006.01)
*H01L 27/32* (2006.01)
*H01L 27/12* (2006.01)
*H01L 29/786* (2006.01)

(52) U.S. Cl.
CPC ............ *H01L 29/06* (2013.01); *H01L 27/1225* (2013.01); *H01L 27/3262* (2013.01); *H01L 29/0657* (2013.01); *H01L 29/0684* (2013.01); *H01L 29/7869* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 6,566,695 B2 | 5/2003 | Kumashiro | |
| 7,608,857 B2 | 10/2009 | Fujimori et al. | |
| 7,692,217 B2 | 4/2010 | Edwards et al. | |
| 2001/0038134 A1* | 11/2001 | Kumashiro | H01L 29/1033 257/394 |
| 2006/0290633 A1* | 12/2006 | Choi | 345/92 |
| 2009/0206332 A1* | 8/2009 | Son et al. | 257/43 |
| 2009/0224245 A1* | 9/2009 | Umezaki | 257/59 |
| 2011/0169001 A1 | 7/2011 | Ozeki et al. | |
| 2012/0037906 A1 | 2/2012 | Ryu et al. | |

FOREIGN PATENT DOCUMENTS

| | | |
|---|---|---|
| JP | 05-323364 A | 12/1993 |
| JP | 2005-079476 A | 3/2005 |
| JP | 2009-135272 A | 6/2009 |

(Continued)

*Primary Examiner* — Fei Fei Yeung Lopez
(74) *Attorney, Agent, or Firm* — Knobbe Martens Olson & Bear LLP

(57) ABSTRACT

A thin film transistor substrate and an organic light-emitting diode (OLED) display are disclosed. In one aspect, the OLED includes a thin film transistor substrate. The thin film transistor substrate includes a substrate, a source electrode formed over the substrate, a drain electrode formed over the substrate and spaced apart from the source electrode, an oxide semiconductor layer, and a gate electrode. The oxide semiconductor layer includes a source area at least partially overlapping the source electrode, a drain area at least partially overlapping the drain electrode, and a channel area formed between the source area and the drain area. The gate electrode, which is insulated from the oxide semiconductor layer, has a first width at a first end thereof, a second width at a second end opposite to the first end thereof and the first width is different from the second width.

17 Claims, 6 Drawing Sheets

(56) References Cited

FOREIGN PATENT DOCUMENTS

| | | | |
|---|---|---|---|
| JP | 2009-200371 A | | 9/2009 |
| KR | 10-622250 | * | 9/2006 |
| KR | 10-0622250 B1 | | 9/2006 |
| KR | 10-0660691 B1 | | 12/2006 |

* cited by examiner

THIN FILM TRANSISTOR SUBSTRATE AND ORGANIC LIGHT-EMITTING DIODE (OLED) DISPLAY HAVING THE SAME

CROSS-REFERENCE TO RELATED APPLICATIONS

This U.S. non-provisional patent application claims priority under 35 U.S.C. §119 of Korean Patent Application No. 10-2013-0135474, filed on Nov. 8, 2013, the contents of which are hereby incorporated by reference in its entirety.

BACKGROUND

1. Field

The described technology generally relates to a thin film transistor substrate and an organic light-emitting diode (OLED) display.

2. Description of the Related Technology

A thin film transistor (TFT) is often used as a switching device in a flat panel display, such as a liquid crystal display, or an OLED display, etc. Mobility or leakage current in the TFT varies according to materials used and the state of the channel layer through which carriers move.

In the standard display device, the channel layer of the TFT is formed of an amorphous silicon layer. The amorphous silicon TFT has advantages, such as low cost, uniform thickness on a large substrate, etc., as well as disadvantages such as low carrier mobility.

In recent years, demand for TFTs with high carrier mobility and high current strength has increased significantly in the market, and thus more effective TFTs are continuing to be developed to provide characteristics appropriate for the intended use.

SUMMARY OF CERTAIN INVENTIVE ASPECTS

One inventive aspect is a thin film transistor substrate having improved characteristics.

Another aspect is an organic light-emitting diode (OLED) display (hereinafter to be interchangeably used with "organic light-emitting display") having the thin film transistor substrate.

Another aspect is a thin film transistor substrate including a substrate, a source electrode disposed on the substrate, a drain electrode disposed on the substrate to be spaced apart from the source electrode, an oxide semiconductor layer that includes a source area overlapped with the source electrode, a drain area overlapped with the drain electrode, and a channel area disposed between the source area and the drain area, and a gate electrode disposed to be insulated from the oxide semiconductor layer. The oxide semiconductor layer has a first width at a first end thereof and a second width at a second end opposite to the first end thereof. And the first width is different from the second width when viewed in a plan view.

Another aspect is an organic light-emitting display including a substrate including a plurality of pixel areas, color filters respectively disposed in the pixel areas, a passivation layer disposed on the color filters, a first electrode disposed on the passivation layer, a light-emitting layer disposed on the first electrode, and a second electrode disposed on the light-emitting layer.

A gate electrode is disposed on the substrate and connected to a gate line.

A gate insulating layer is disposed on the substrate to cover the gate electrode and an oxide semiconductor layer is disposed on the gate insulating layer to correspond to the gate electrode.

The oxide semiconductor layer includes a source area overlapped with a source electrode, a drain area overlapped with a drain electrode, and a channel area disposed between the source area and the drain area.

The oxide semiconductor layer includes an oxide semiconductor material. The oxide semiconductor material includes at least one of indium, gallium, zinc, or tin.

The oxide semiconductor layer has a first width at a first end thereof and a second width at a second end opposite to the first end thereof when viewed in a plan view. The width of the oxide semiconductor layer gradually increases from the first end to the second end.

The organic light-emitting display further includes an etch stopper formed over the channel area of the oxide semiconductor layer and interposed between the oxide semiconductor layer and the source electrode, and between the oxide semiconductor layer and the drain electrode. In the above substrate, the etch stopper is formed at least partially of an insulating material.

Another aspect is an organic light-emitting display including an oxide semiconductor layer, a gate insulating layer disposed on the oxide semiconductor layer, and a gate electrode disposed on the gate insulating layer to correspond to the oxide semiconductor layer. The organic light-emitting display further includes a buffer layer disposed under the oxide semiconductor layer to protect the oxide semiconductor layer.

Another aspect is an organic light-emitting diode (OLED) display comprising a display element and a thin film transistor configured to drive the display element. The thin film transistor comprises a source electrode, a drain electrode spaced apart from the source electrode, an oxide semiconductor layer, and a gate electrode insulated from the oxide semiconductor layer. The oxide semiconductor includes a source area at least partially overlapping the source electrode, a drain area at least partially overlapping the drain electrode, and a channel area formed between the source area and the drain area. The oxide semiconductor layer has a first width at a first end thereof and a second width at a second end opposite to the first end thereof. The first width is different from the second width.

In the above display, the oxide semiconductor layer comprises at least one of indium, gallium, zinc, or tin. In the above display, the width of the oxide semiconductor layer gradually increases from the source area to the drain area. In the above display, the display element further comprises a first electrode, a second electrode spaced apart from the first electrode, and a light-emitting layer formed between the first electrode and the second electrode.

In the above display, the display element is an organic light-emitting layer. In the above display, the gate electrode at least partially overlaps the source area, the channel area, and the drain area and formed below the oxide semiconductor layer. In the above display, the gate electrode is formed only in the channel area. The above display further comprises a buffer layer formed below the oxide semiconductor layer.

Another aspect is a thin film transistor substrate for a display device comprising a substrate, a source electrode formed over the substrate, a drain electrode formed over the substrate and spaced apart from the source electrode, and an oxide semiconductor layer. The oxide semiconductor layer includes a source area at least partially overlapping the source electrode, a drain area at least partially overlapping the drain electrode, and a channel area formed between the source area and the drain area. The width of the oxide semiconductor layer varies.

In the above substrate, the oxide semiconductor layer comprises a first portion overlapping the source electrode and a second portion overlapping the drain electrode.

According to at least one embodiment, the amount of the current flowing through the thin film transistor may be controlled, and thus the characteristics of the thin film transistor may be improved. As a result, the display quality of the organic light-emitting display may be improved.

DETAILED DESCRIPTION OF CERTAIN INVENTIVE EMBODIMENTS

Figure 1:
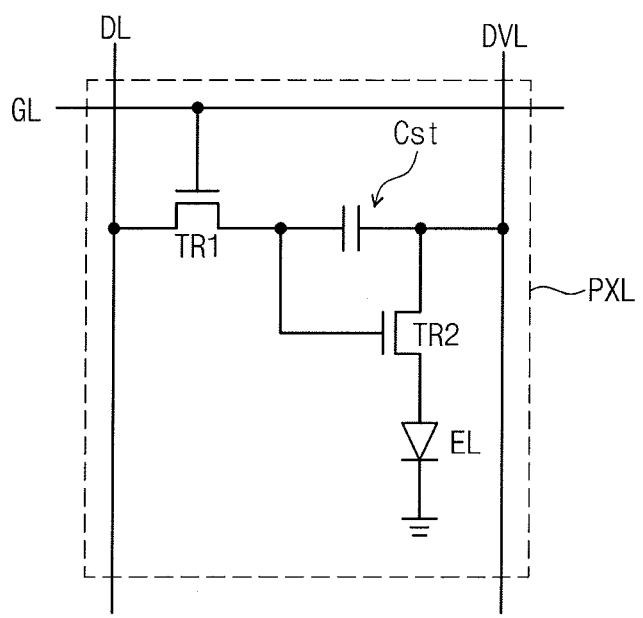
FIG. 1 is a circuit diagram showing an organic light-emitting display according to an exemplary.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the described technology. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present described technology will be explained in detail with reference to the accompanying drawings.

Figure 2:
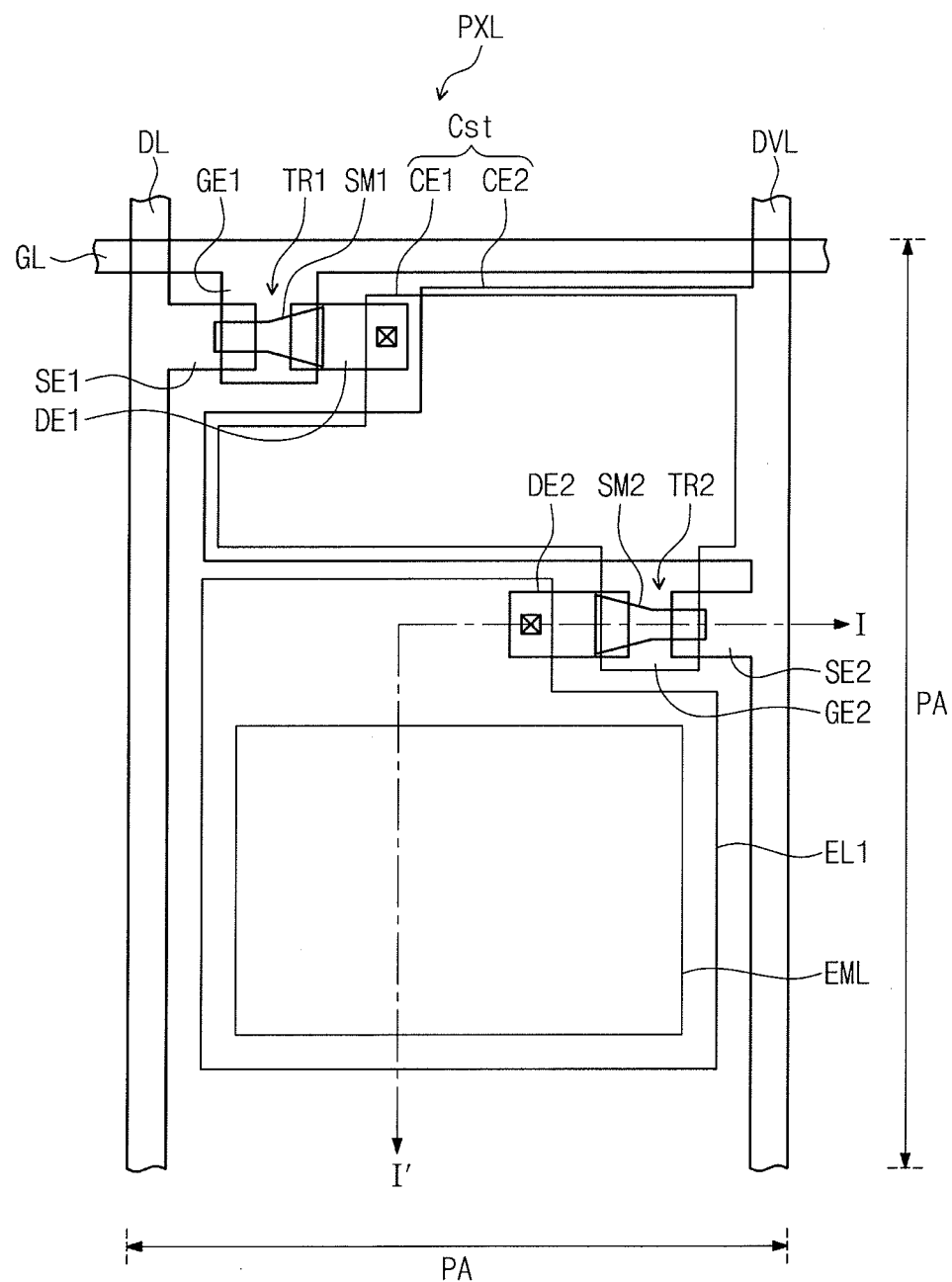
FIG. 2 is a plan view showing a pixel shown in FIG. 1.
Figure 3:
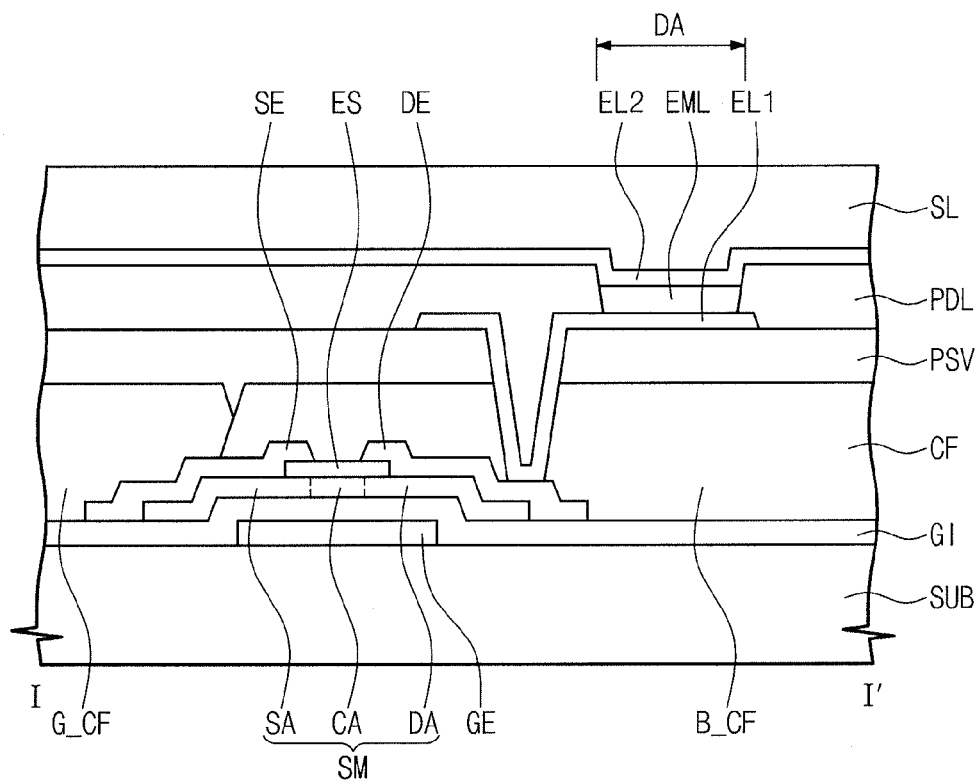
FIG. 3 is a cross-sectional view taken along a line I-I' of FIG. 2.

FIG. 1 is a circuit diagram showing an organic light-emitting display according to an exemplary embodiment. FIG. 2 is a plan view showing a pixel shown in FIG. 1. FIG. 3 is a cross-sectional view taken along a line I-I' of FIG. 2.

Referring to FIGS. 1 to 3, the organic light-emitting display includes at least one pixel PXL to display an image. The pixel PXL is formed in a pixel area PA. In another embodiment, the pixel PXL includes a plurality of pixels and can be arranged in a matrix form. However, since the pixels have the same structure and function, for convenience of explanation, only one pixel PXL has been shown in FIGS. 1 to 3. In some embodiments, the pixel PXL has a rectangular shape, but it should not be limited thereto or thereby. In addition, the pixels can have different sizes.

The pixel PXL includes a line part including a gate line GL, a data line DL, and a driving voltage line DVL, a thin film transistor connected to the line part, an organic light-emitting diode (OLED) device (hereinafter to be interchangeably used with "organic light-emitting device") EL connected to the thin film transistor, and a capacitor Cst.

The gate line GL extends in one direction and the data line DL extends in a substantially perpendicular direction to cross the gate line GL in one corner of the pixel. The driving voltage line DVL extends in the same direction as the data line DL and at least partially crosses the gate line GL at another corner of the pixel. The gate line GL applies a scan signal to the thin film transistor, the data line DL applies a data signal to the thin film transistor, and the driving voltage line DVL applies a driving voltage to the thin film transistor.

In some embodiments, the pixel PXL includes a driving thin film transistor TR2 to control the operation of the organic light-emitting device EL and a switching thin film transistor TR1 to switch the driving thin film transistor TR2 between on and off states. In the present exemplary embodiment, one pixel PXL includes two thin film transistors TR1 and TR2, but the number of the thin film transistors should not be limited to two in other configurations, meaning one pixel can include one thin film transistor and one capacitor, or three or more thin film transistors and two or more capacitors.

The switching thin film transistor TR1 includes a first gate electrode GE1, a first source electrode SE1, and a first drain electrode DE1. The first gate electrode GE1 is connected to the gate line GL, the first source electrode SE1 is connected to the data line DL, and the first drain electrode DE1 is connected to a second gate electrode GE2 of the driving thin film transistor TR2. The switching thin film transistor TR1 outputs the data signal applied to the data line DL to the driving thin film transistor TR2 in response to the scan signal applied to the gate line GL. The voltage level of the scan signal applied to the gate line GL controls the operation of the switching thin film transistor TR1.

The driving thin film transistor TR2 includes the second gate electrode GE2, a second source electrode SE2, and a second drain electrode DE2. The second gate electrode GE2 is connected to the first drain electrode DE1 of the switching thin film transistor TR1. The second source electrode SE2 is connected to the driving voltage line DVL. The second drain electrode DE2 is connected to the organic light-emitting device EL.

The organic light-emitting device EL includes a light-emitting layer EML, a first electrode EL1, and a second electrode EL2, with the light-emitting layer EML formed between the first electrode EL1 and the second electrode EL2. The first electrode EL1 is connected to the second drain electrode DE2 of the driving thin film transistor TR2. The second electrode EL2 is applied with a common voltage. The light-emitting layer EML emits light in response to an output signal from the driving thin film transistor TR2, thereby displaying a desired image.

The capacitor Cst is connected between the second gate electrode GE2 and the second source electrode SE2 of the driving thin film transistor TR2. The capacitor Cst is charged with the data signal applied to the second gate electrode GE2 of the driving thin film transistor TR2.

Hereinafter, the organic light-emitting display will be described in accordance with the stacking order of components thereof.

In the organic light-emitting display, a substrate SUB includes the pixel area PA in which the pixel PXL is formed. The substrate SUB can be formed at least partially of an insulating material, e.g., glass, plastic, or crystal.

The first and second gate electrodes GE1 and GE2 respectively connected to the gate line GL and the second drain electrode DE2 of the switching thin film transistor TR2 are formed on the substrate SUB.

The first and second gate electrodes GE1 and GE2 include a conductive material, e.g., a metal material and/or a metal oxide material. Each of the first and second gate electrodes GE1 and GE2 can be at least partially formed of a single conductive material and/or a single metal oxide material, but the material should not be limited thereto or thereby. That is, each of the gate electrodes GE1 and GE2 can include two or more metal materials and/or two or more metal oxide material, or two or more metal alloys. In addition, each of the gate electrodes GE1 and GE2 has a single-layer structure or a multi-layer structure. For example, each of the gate electrodes GE1 and GE2 can include a copper layer and a metal oxide layer formed on or under the copper layer. The metal oxide layer can include, for example, indium tin oxide, indium zinc oxide, gallium zinc oxide, indium gallium zinc oxide, or zinc aluminum oxide.

A gate insulating layer GI is formed on the substrate SUB to cover the first and second gate electrodes GE1 and GE2. The gate insulating layer GI can include silicon nitride (SiNx), silicon oxide (SiOx), silicon oxy-nitride (SiOxNy), etc.

A first oxide semiconductor layer SM1 and a second oxide semiconductor layer SM2 are formed on the gate insulating layer GI to respectively correspond to the first and second gate electrodes GE1 and GE2.

The first and second oxide semiconductor layers SM1 and SM2 are at least partially formed of a semiconductor material and serve as active layers of the switching thin film transistor TR1 and the driving thin film transistor TR2, respectively. Each of the first and second oxide semiconductor layers SM1 and SM2 includes a source area SA at least partially overlapping a source electrode SE, a drain area DA at least partially overlapping a drain electrode DE, and a channel area CA formed between the source area SA and the drain area DA.

The first and second oxide semiconductor layers SM1 and SM2 include an oxide semiconductor material containing at least one of indium (In), gallium (Ga), zinc (Zn), and tin (Sn). For example, the first and second oxide semiconductor layers SM1 and SM2 can include zinc oxide, tin oxide, indium oxide, indium-zinc oxide, indium-tin oxide, indium-gallium-zinc oxide, indium-zinc-tin oxide, indium-gallium-zinc-tin oxide, etc.

Figure 4:
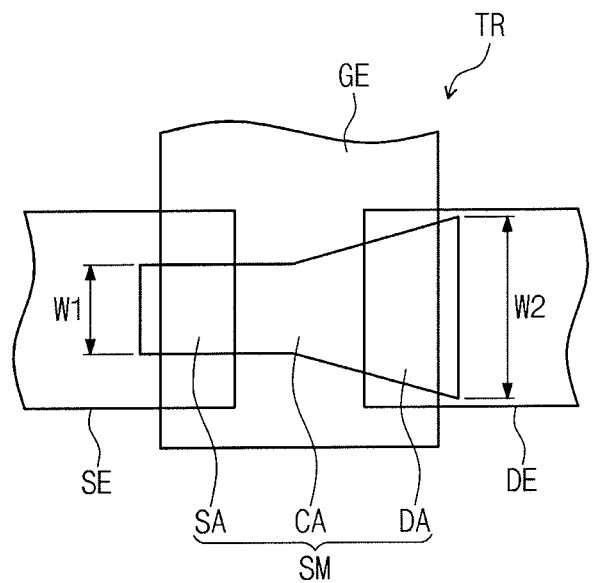
FIG. 4 is an enlarged plan view showing a thin film transistor.

Each of the oxide semiconductor layers SM1 and SM2 has a non-uniform width when viewed in a plan view (see FIG. 4). For example, the width of each of the oxide semiconductor layers SM1 and SM2 becomes greater from one end thereof to the other end thereof.

An etch stopper ES at least partially formed of an insulating material is formed on the channel area CA of each of the first and second oxide semiconductor layers SM1 and SM2.

The first source electrode SE1 and the first drain electrode DE1 spaced apart from the first source electrode SE1 are formed on the first oxide semiconductor layer SM1. At least a portion of the etch stopper ES is formed between the first source electrode SE1 and the first drain electrode DE1 above the channel area CA of the first semiconductor layer SM1.

The second source electrode SE2 and the second drain electrode DE2 spaced apart from the second source electrode SE2 are formed on or over the second oxide semiconductor layer SM2. At least a portion of the etch stopper ES is formed between the second source electrode SE2 and the second drain electrode DE2 above the channel area CA of the second semiconductor layer SM2.

The etch stopper ES above the channel area CA of the first semiconductor layer SM1 and the etch stopper ES above the channel area CA of the second semiconductor layer SM2 can be spaced apart from each other.

Color filters CF are can be formed on the first source electrode SE1, the first drain electrode DE1, the second source electrode SE2, the second drain electrode DE2, and the gate insulating layer GI.

The color filters CF can correspond to the pixel areas PA in a one-to-one correspondence. The color filters CF include color filters representing different colors from each other. For instance, the color filters CF include a first color filter, a second color filter, and a third color filter, which represent different colors from each other. The first, second, and third color filters can be red, green, and blue color filters R_CF, G_CF, and B_CF that represent red, green, and blue colors, respectively. The color filters CF can further include color filters to represent cyan, magenta, yellow, and white colors.

As a representative example, FIG. 3 shows the green color filter G_CF and the blue color filter B_CF formed in a pixel area PA adjacent to each other.

A passivation layer PSV is formed on the color filters CF. The passivation layer PSV includes an inorganic insulating material, e.g., silicon nitride or silicon oxide.

The passivation layer PSV serves as a protective layer to protect the switching thin film transistor TR1 and the driving thin film transistor TR2 and as a planarization layer to planarize an upper surface of the color filters CF.

A first electrode EL1 is formed on the passivation layer PSV as an anode of the organic light-emitting device EL. The first electrode EL1 is connected to the second drain electrode DE2 of the driving thin film transistor TR2 through a contact hole formed through the passivation layer PSV. Here, the first electrode EL1 can serve as a cathode of the organic light-emitting device EL, but it will be described as the anode in the following description.

The first electrode EL1 can be at least partially formed of a material having a high work function. The first electrode EL1 can also be a transparent conductive layer at least partially formed of indium tin oxide, indium zinc oxide, zinc oxide, indium tin zinc oxide, etc., when the image is displayed in a downward direction with respect to the substrate SUB.

A pixel definition layer PDL is formed on the substrate SUB on which the above-mentioned elements are formed. The purpose of the pixel definition layer PDL is to partition the pixel areas PA corresponding to the pixels PXL. The pixel definition layer PDL exposes the upper surface of the first electrode EL1 and protrudes from the substrate SUB along a substantially surrounding of the pixel PXL.

The light-emitting layer EML is formed in the pixel area PA substantially surrounded by the pixel definition layer PDL. A second electrode EL2 is formed on the light-emitting layer EML.

The light-emitting layer EML emits a white light. The light-emitting layer EML can be at least partially formed of various light-emitting materials, each including a host and a dopant. A fluorescent dopant and a phosphor dopant can be used for the dopant. For the host, Alq3C CBP(4,4'-N,N'-dicarbasol-biphenyl), 9,10-di(naphthalene-2-yl)anthracen (ADN), or DSA (distyrylarylene) can be used, but the host should not be limited thereto or thereby.

The second electrode EL2 can include a material with a low work function such as a metal, a metal alloy, an electroconductive compound, and/or a mixture thereof. As an example, the second electrode EL2 includes lithium (Li), magnesium (Mg), aluminum (Al), aluminum-lithium (Al—Li), calcium (Ca), magnesium-indium (Mg—In), magnesium-silver (Mg—Ag), etc.

In this embodiment, a hole injection layer and a hole transport layer can be formed between the first electrode EL1 and the light-emitting layer EML. An electron injection layer and an electron transport layer can be formed between the light-emitting layer EML and the second electrode EL2. Therefore, when the first electrode EL1 is used as the anode, the above-mentioned layers are sequentially stacked in the order of the first electrode EL1, the hole injection layer, the hole transport layer, the light-emitting layer EML, the electron transport layer, the electron injection layer, and the second electrode EL2. When the first electrode EL1 is used as a cathode, the above-mentioned layers can be sequentially stacked in the order of the first electrode EL1, the electron injection layer, the electron transport layer, the light-emitting layer EML, the hole transport layer, the hole injection layer, and the second electrode EL2.

A sealant layer SL is formed on the second electrode EL2 to cover the second electrode EL2.

Hereinafter, the first and second oxide semiconductor layers (hereinafter, referred to as an oxide semiconductor layer) will be described in detail.

FIG. 4 is an enlarged plan view showing the thin film transistor.

Referring to FIG. 4, the oxide semiconductor layer SM at least partially overlaps the gate electrode GE when viewed in a plan view. The oxide semiconductor layer SM includes i) the source area SA at least partially overlapping the source electrode SE, ii) the drain area DA at least partially overlapping the drain electrode DE, and iii) the channel area CA formed between the source area SA and the drain area DA.

The width of the oxide semiconductor layer SM can vary when viewed in a plan view. The width is measured in a direction substantially perpendicular to a longitudinal direction of the oxide semiconductor layer SM in which the oxide semiconductor layer SM extends from the source area SA to the drain area DA.

The source area SA of the oxide semiconductor layer SM has a first width W1 and the drain area DA of the oxide semiconductor layer SM has a second width W2. In some embodiment, the first width W1 is smaller than the second width W2.

The width of the channel area CA adjacent to the source area SA is different from the width of the channel area CA adjacent to the drain area DA. In the present embodiment, the width of the channel area CA adjacent to the source area SA is less than the width of the channel area CA adjacent to the drain area DA. The width of the oxide semiconductor layer SM can substantially gradually increase as it goes closer from the source area SA to the drain area DA.

As described above, when the source area SA of the oxide semiconductor layer SM has the width smaller than that of the drain area DA of the oxide semiconductor layer SM, an amount of saturation current flowing through the channel area CA can be controlled by controlling the voltages of the source electrode SE, and the drain electrode DE, and gate electrode GE. For example, the amount of the saturation current flowing through the channel area CA can be substantially proportional to the width of the oxide semiconductor layer SM according to the driving voltage. Conversely, the amount of the saturation current can be substantially inversely proportional to a length of the channel area CA.

In some embodiments, the oxide semiconductor layer SM substantially uniformly maintains the amount of the saturation current flowing through the channel area CA by substantially preventing a variation in a ratio of the channel width W to the channel length L (W/L).

In addition, since the first width W1 is less than the second width W2, the current can be substantially prevented from flowing to the source area SA from the drain area DA. Thus, the characteristics of the thin film transistor TR can be improved by decreasing the leakage current.

Figure 5:
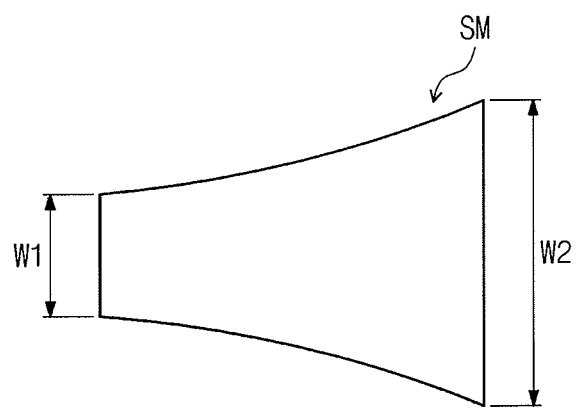
FIGS. 5 to 7 are plan views showing oxide semiconductor layers according to another exemplary embodiment.
Figure 6:
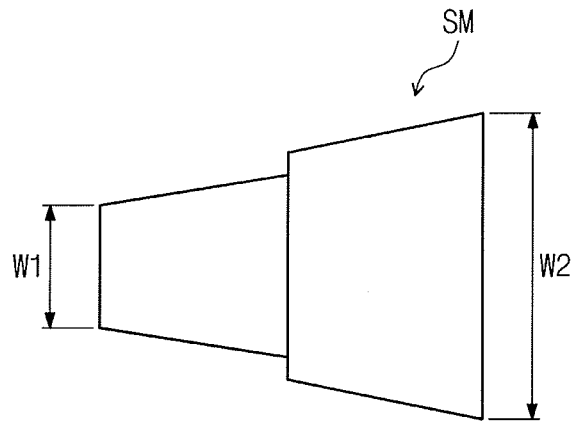
Figure 7:
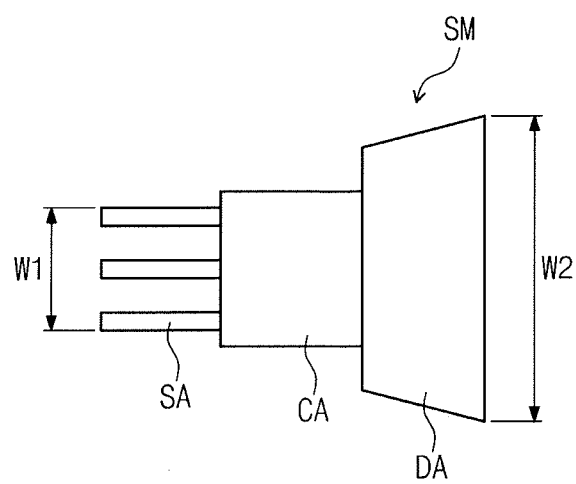

FIGS. 5 to 7 are plan views showing oxide semiconductor layers according to another exemplary embodiment.

In some embodiments, as shown in FIG. 5, an oxide semiconductor layer SM has a width that continuously increases from a first width W1 at a first end thereof to a second width W2 at a second end opposite to the first end thereof.

In another embodiment, as shown in FIG. 6, an oxide semiconductor layer SM has a width that increases from a first width W1 at a first end thereof to a second width W2 at a second end opposite to the first end thereof when viewed in a plan view. The width of the oxide semiconductor layer SM can rapidly increase at some position between the first end and the second end. As a result, a stepped portion exists between the first end and the second end of the oxide semiconductor layer SM.

Referring to FIG. 7, an oxide semiconductor layer SM includes a source area SA, a drain area DA, and a channel area CA formed between the source area SA and the drain area DA. When viewed in a plan view, a boundary portion between the channel area CA and the drain area DA has a step difference. The drain area DA has a width greater than the width of the channel area CA which gradually increases as it moves away from the channel area CA.

In some embodiments, the source area SA includes a plurality of portions (e.g., three) branched from the channel area CA. The source area SA has a first width W1 less than the width W2 of the drain area DA. While the FIG. 7 embodiment has three portions in the source area SA, the number of the portions of the source area SA should not be limited to three. The size of the gap between the different portions of the source area SA can vary.

In the present exemplary embodiment, the organic light-emitting display includes a top gate type thin film transistor having the etch stopper, but the organic light-emitting display should not be limited to the top gate type thin film transistor. Thus, the structure of the thin film transistor can be applied to a back channel etch type thin film transistor or a top gate type thin film transistor.

Figure 8:
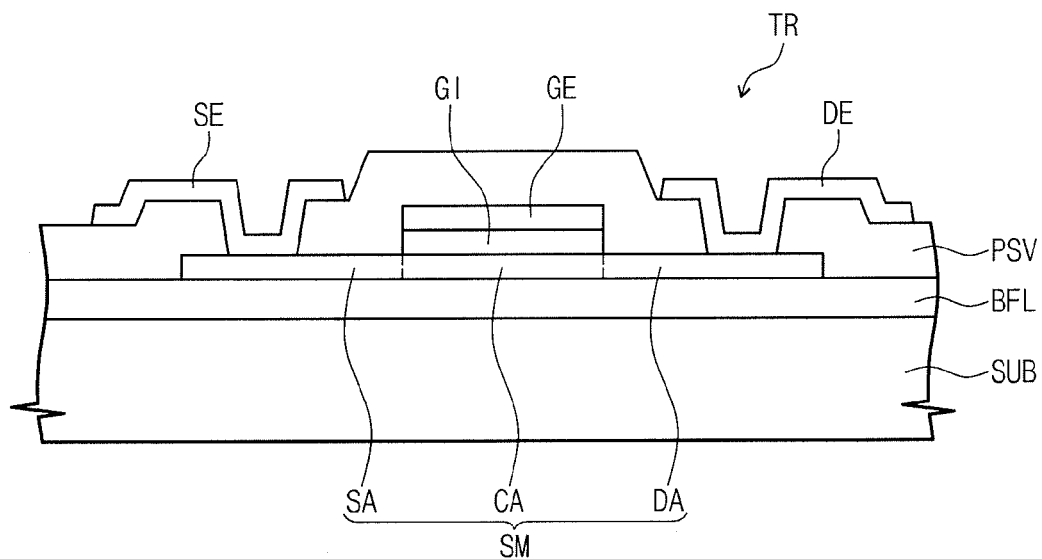
FIG. 8 is a cross-sectional view showing a thin film transistor according to another exemplary embodiment.
Figure 9:
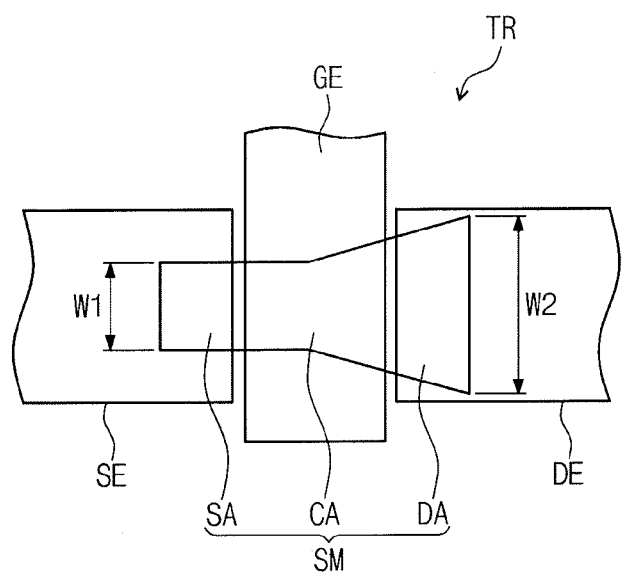
FIG. 9 is a plan view showing a thin film transistor according to another exemplary embodiment.

FIG. 8 is a cross-sectional view showing a thin film transistor according to another exemplary embodiment. FIG. 9 is a plan view showing a thin film transistor according to another exemplary embodiment.

Hereinafter, an organic light-emitting display including a thin film transistor having a coplanar structure will be described in detail with reference to FIGS. 8 and 9.

Referring to FIGS. 8 and 9, the organic light-emitting display includes a substrate SUB on which a display element (not shown) is formed and a thin film transistor TR that applies a driving signal to the display element. The substrate SUB can be an insulating substrate, e.g., a glass substrate, a plastic substrate, or a crystal substrate.

A buffer layer BFL is formed on the substrate SUB. The buffer layer BFL can substantially prevent unwanted foreign matters from being diffused to the thin film transistor TR. The buffer layer BFL can include silicon nitride (SiNx), silicon oxide (SiOx), or silicon oxy-nitride (SiOxNy), but the buffer layer BFL can be omitted depending on what material is used for the substrate SUB and under what conditions the organic light-emitting display is made.

An oxide semiconductor layer SM is formed on the buffer layer BFL. The oxide semiconductor layer SM includes i) a source area SA at least partially overlapping a source electrode SE, ii) a drain area DA at least partially overlapping a drain electrode DE, and iii) a channel area CA formed between the source area SA and the drain area DA.

The oxide semiconductor layer SM can include an oxide semiconductor material containing at least one of indium (In), gallium (Ga), zinc (Zn), and tin (Sn). For instance, the oxide semiconductor layer SM can include zinc oxide, tin oxide, indium oxide, indium-zinc oxide, indium-tin oxide, indium-gallium-zinc oxide, indium-zinc-tin oxide, indium-gallium-zinc-tin oxide, etc.

In some embodiments, as shown in FIG. 9, the width of the oxide semiconductor layer SM varies when viewed in a plan view. For example, the width of the oxide semiconductor layer SM becomes wider from one end thereof to the other end thereof.

A gate insulating layer GI is formed on the channel area CA of the oxide semiconductor layer SM and a gate electrode GE is formed on the gate insulating layer GI.

A passivation layer PSV is formed over the oxide semiconductor layer SM and the gate electrode GE to substantially cover the oxide semiconductor layer SM and the gate electrode GE.

The source electrode SE and the drain electrode DE at least partially cover the passivation layer PSV. The source electrode SE is electrically connected to the source area SA of the oxide semiconductor layer SM through the passivation layer PSV and the drain electrode DE is electrically connected to the drain area DA of the oxide semiconductor layer SM.

As described above, since the source area SA of the oxide semiconductor layer SM has a width less than that of the drain area DA of the oxide semiconductor layer SM, an amount of saturation current flowing through the channel area CA can be controlled.

As described above, the thin film transistor can be a bottom gate type thin film transistor having the etch stopper or the top gate coplanar thin film transistor, but it should not be limited thereto or thereby. That is, the structure of the thin film transistor can be applied to a back channel etch type thin film transistor or a top gate type thin film transistor.

In the present exemplary embodiment, the organic light-emitting display has been described as a representative example, but the thin film transistor can be applied to other display devices, e.g., a liquid crystal display device, an electrophoretic display device, an electrowetting display device, etc. The electrophoretic display device includes an electrophoretic layer to display the image using an electrophoretic phenomenon. The electrowetting display device includes an electrowetting layer to display the image using an electrowetting phenomenon between two fluids.

Although the exemplary embodiments of the described technology have been described, it is understood that the described technology should not be limited to these exemplary embodiments but various changes and modifications can be made by one ordinary skilled in the art within the spirit and scope of the described technology as hereinafter claimed.

What is claimed is:

1. A thin film transistor substrate for a display device, comprising:
   a substrate;
   a source electrode formed over the substrate;
   a drain electrode formed over the substrate and spaced apart from the source electrode;
   an oxide semiconductor layer that includes i) a source area at least partially overlapping the source electrode, ii) a drain area at least partially overlapping the drain electrode, and iii) a channel area formed between the source area and the drain area; and
   a gate electrode insulated from the oxide semiconductor layer, wherein the oxide semiconductor layer has a first width at a first end thereof and a second width at a second end opposite to the first end thereof and the first width is different from the second width, wherein a width of the source area of the oxide semiconductor layer is substantially uniform and the drain area of the oxide semiconductor layer gradually increases in width from the channel area to the second end of the oxide semiconductor layer.

2. The thin film transistor substrate of claim 1, wherein the oxide semiconductor layer comprises at least one of indium, gallium, zinc, or tin.

3. The thin film transistor substrate of claim 2, wherein the first end of the oxide semiconductor layer is positioned at the source area.

4. The thin film transistor substrate of claim 3, wherein the second end of the oxide semiconductor layer is positioned at the drain area.

5. The thin film transistor substrate of claim 4, wherein the first width is less than the second width.

6. A thin film transistor substrate for a display device, comprising:
   a substrate;
   a source electrode formed over the substrate;
   a drain electrode formed over the substrate and spaced apart from the source electrode;
   an oxide semiconductor layer that includes i) a source area at least partially overlapping the source electrode, ii) a drain area at least partially overlapping the drain electrode, and iii) a channel area formed between the source area and the drain area; and a gate electrode insulated from the oxide semiconductor layer, wherein the oxide semiconductor layer has a first width at a first end thereof and a second width at a second end opposite to the first end thereof and the first width is different from the second width, wherein the oxide semiconductor layer comprises at least one of indium, gallium, zinc, or tin, and wherein the source area of the oxide semiconductor layer comprises a plurality of portions branched from the channel area.

7. The thin film transistor substrate of claim 1, further comprising an etch stopper formed over the channel area of the oxide semiconductor layer and interposed between the oxide semiconductor layer and the source electrode, and between the oxide semiconductor layer and the drain electrode.

8. The thin film transistor substrate of claim 7, wherein the etch stopper is formed at least partially of an insulating material.

9. An organic light-emitting diode (OLED) display comprising:

a display element; and a thin film transistor configured to drive the display element, wherein the thin film transistor comprises i) a source electrode, ii) a drain electrode spaced apart from the source electrode iii) an oxide semiconductor layer that includes a source area at least partially overlapping the source electrode, a drain area at least partially overlapping the drain electrode, and a channel area formed between the source area and the drain area, and iv) a gate electrode insulated from the oxide semiconductor layer, wherein the oxide semiconductor layer has a first width at a first end thereof and a second width at a second end opposite to the first end thereof, wherein the first width is different from the second width, wherein the oxide semiconductor layer has third and fourth widths respectively at first and second intermediate portions directly connected to each other, wherein the oxide semiconductor layer linearly increases in width from the first end to the first intermediate portion at a first slope and from the second intermediate portion to the second end at a second slope, wherein the oxide semiconductor layer increases in width from the first intermediate portion to the second intermediate portion at a third slope greater than the first and second slopes, and wherein the second intermediate portion extends upwardly and downwardly from the first intermediate portion.

10. The OLED display of claim 9, wherein the oxide semiconductor layer comprises at least one of indium, gallium, zinc, or tin.

11. The OLED display of claim 10, wherein the width of the oxide semiconductor layer gradually increases from the source area to the drain area.

12. The OLED display of claim 9, wherein the display element comprises:

a first electrode;

a second electrode spaced apart from the first electrode; and a light-emitting layer formed between the first electrode and the second electrode.

13. The OLED display of claim 12, wherein the display element is an organic light-emitting layer.

14. The OLED display of claim 9, wherein the gate electrode at least partially overlaps the source area, the channel area, and the drain area.

15. The OLED display of claim 9, wherein the gate electrode is formed below the oxide semiconductor layer.

16. The OLED display of claim 9, wherein the gate electrode is formed only in the channel area.

17. The OLED display of claim 9, further comprising a buffer layer formed below the oxide semiconductor layer.

* * * * *